United States Patent [19]
Smith et al.

[11] Patent Number: 5,136,237
[45] Date of Patent: Aug. 4, 1992

[54] DOUBLE INSULATED FLOATING HIGH VOLTAGE TEST PROBE

[75] Inventors: Monty Smith, Forest Grove; Julie A. Campbell, Portland, both of Oreg.

[73] Assignee: Tektronix, Inc., Beaverton, Oreg.

[21] Appl. No.: 647,315

[22] Filed: Jan. 29, 1991

[51] Int. Cl.⁵ .................. G01R 1/06; G01R 31/02
[52] U.S. Cl. ................................. 324/149; 324/72.5
[58] Field of Search ............. 324/149, 158 P, 72.5

[56] References Cited

U.S. PATENT DOCUMENTS 4,209,742 6/1980 Bender et al. .................. 324/72.5

Primary Examiner—Walter E. Snow
Attorney, Agent, or Firm—William K. Bucher

[57] ABSTRACT

A measurement probe has a probe tip coaxially disposed within one end of a elongate cylindrical outer conductor with the probe tip extending beyond the end of the outer conductor. A body of insulating material surrounds the outer conductor and a portion of the probe tip to provide electrical isolation between the probe tip and the outer conductor. A notch is formed in the insulating material distant from the probe tip to expose the outer conductor for providing an electrical connection between an outer conductor of a removable adapter and the elongate cylindrical outer conductor of the measurement probe. The measurement probe meets all safety standards for use as a floating measurement probe as well as being adaptable for providing a coaxial signal path having a common voltage ground.

21 Claims, 3 Drawing Sheets

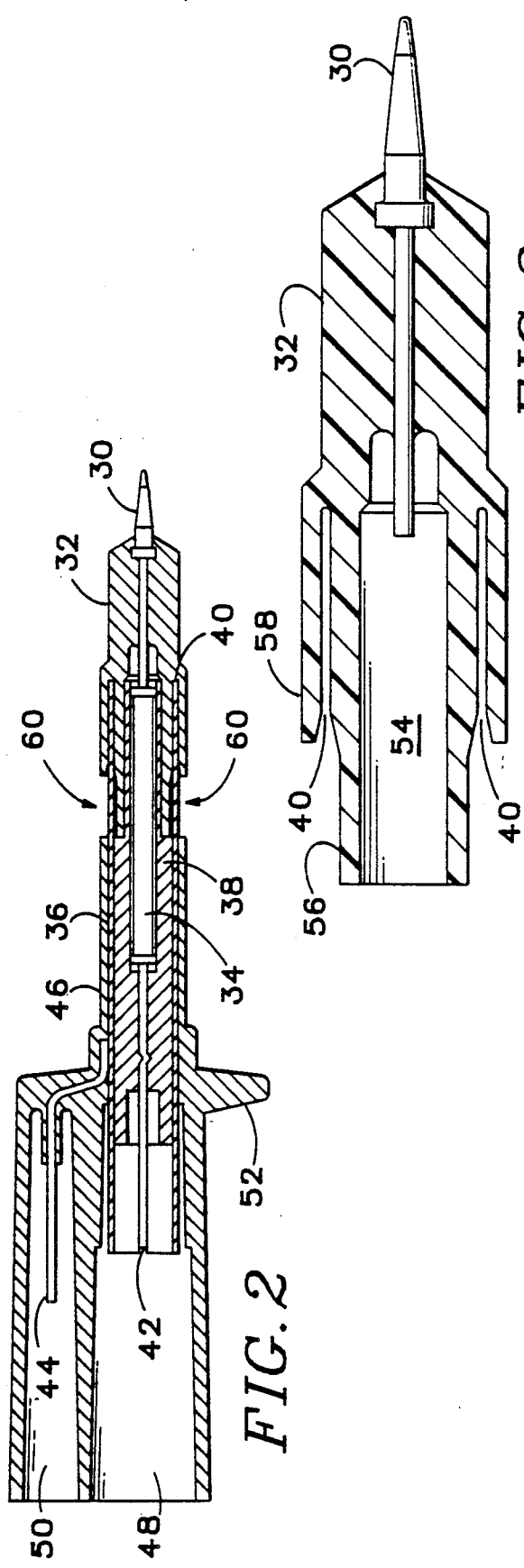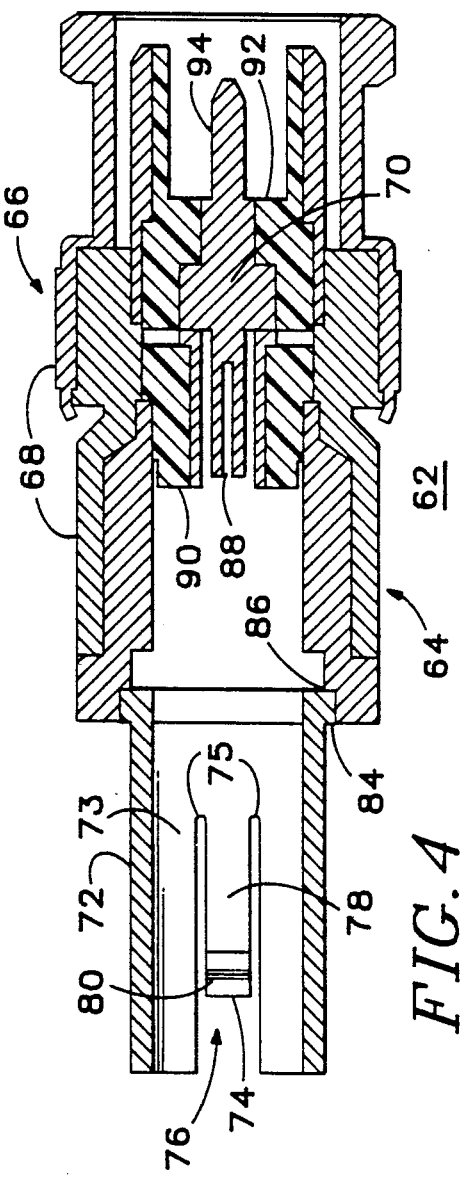

DOUBLE INSULATED FLOATING HIGH VOLTAGE TEST PROBE

BACKGROUND OF THE INVENTION

The present invention relates to measurement probes and more particularly to electrical test probes for coupling electrical signals to testing equipment from a device under test.

A variety of measurement probes, such as low and high voltage probes, current probes, temperature probes, and the like, have been developed for monitoring functions in devices under test. These probes have a signal input head connected to a termination output coupler via a flexible transmission line, or cable. The termination output coupler is connected to an input of an oscilloscope or other electrical test instrument and the signal input head is used to probe the device under test.

Low voltage probes are generally used for monitoring voltages in electronic circuits. To reduce electromagnetic interference, EMI, and prevent the degrading of the electrical signal being monitored, low voltage probes have a probe tip coaxially disposed within one end of a elongate cylindrical outer conductor with one end of the probe tip extending beyond the end of the outer conductor for probing the device under test. An insulating plug is used to secure the probe tip in the cylindrical outer conductor. Passive or active circuitry mounted on a substrate is disposed within the elongate cylindrical outer conductor and is electrically coupled to the other end of the probe tip. The transmission line is electrically connected to the substrate to couple the electrical signal from the signal input head to the termination output coupler, which is connected to the input of the test instrument. Insulating material surrounds a substantial portion of the elongate cylindrical outer conductor. A portion of the outer conductor is exposed near the probe tip to allow the placement of various probing adapters, such as a BNC type connector on the probe. A representative low voltage probe having the above characteristics is the P6106A Passive Voltage Probe, manufactured and sold by Tektronix, Inc., Beaverton, Oregon. A BNC type probe adapter for use with the P6106A probe is manufactured and sold by Tektronix, Inc., under part No. 013-0084-02.

The BNC probe adapter has a BNC connector at one end and a cylindrical metal tube extending from the other end. The metal tube has a first inner diameter providing clearance for the insulating material surrounding the cylindrical outer conductor of the probe. A second inner diameter, proximate the BNC connector, is slightly smaller than the cylindrical outer conductor of the probe and has slots formed parallel to the axis of the tube creating fingers for gripping the end of the cylindrical outer conductor. The BNC connector has a central conductor coaxially disposed and electrically insulated from an outer conductor. The outer conductor of the BNC connector is electrically connected to the cylindrical metal tube. The probe tip of the probe mates with the central conductor of the BNC connector and the cylindrical metal tube engages the cylindrical outer conductor of the probe to provide a coaxial signal path for signals coupled through the BNC connector to the probe.

Voltage measurement probes have a voltage rating to warn a user that potential life threatening electrical shock can occur if the probe is used beyond the specified rating. Arcing between the probe tip and the outer conductor of the probe is possible if the voltage rating of the probe is exceeded. Insulation standards have been set by Underwriters Laboratories, UL, for electrical and electronic measuring and test equipment (UL1244) that establishes minimum distances between conductive elements and between conductive elements and the user for particular voltage ratings. For example, electrical equipment having a peak AC voltage rating of between 212-315 volts must have a minimum distance separation through air of 0.140 inches and an over surface separation of 0.180 inches between conductive elements and between any exposed conductive element and a user. Generally, low voltage probes are single insulated devices. The UL standard for single insulation is two times the peak AC voltage rating of the probe plus 1,414 peak AC volts during 60 Hz high voltage testing. The standard for double insulated probes is 4 times the peak AC voltage rating of the probe plus 2,878 peak AC volts. As the voltage level rating for a probe increase so does the minimum distance separation standards. This causes high voltage probes to be much larger than low voltage probes.

In most applications, voltage probing is performed with the voltage signal being referenced to a common voltage ground. The common voltage ground comes from the test instrument and is coupled to the signal input head through the termination output connector and the transmission line of the probe. Additionally, an electrical connection is provided at the signal input head for connecting the outer conductor of the signal input head to the common voltage ground of the device under test. Specially designed test equipment can perform floating measurements where the common voltage is no longer grounded, but can float to a non-ground voltage potential. In this case, the common voltage comes from the device under test and not the test instrument. An electrical connection is provided at the signal input head for connecting the outer conductor of the probe to a voltage source. For high voltage floating measurements, user safety requires that both the signal and the outer conductor of the measurement probe be shielded. In addition, UL standards require double insulation for probes making floating measurements.

Conventional low voltage probes do not meet the strict safety requirements for floating measurements and floating measurement probes specifically designed for high voltage floating measurements cannot be used with probe adapters for common voltage ground measurements. What is needed is a measurement probe that is usable as a floating measurement probe and a low voltage probe with probe adapters.

SUMMARY OF THE INVENTION

In accordance with the present invention a measurement probe has a probe tip coaxially disposed within one end of an elongate cylindrical outer conductor with the probe tip extending beyond the end of the outer conductor. A body of insulating material surrounds the elongate cylindrical outer conductor and a portion of the probe tip to provide electrical isolation between the probe tip and the outer conductor. A notch is formed in the insulating material distant from the probe tip to expose the outer conductor for providing a means for electrically connecting an outer conductor of removable adapter to the elongate cylindrical outer conductor of the measurement probe. Means are provided for an electrical connection between the elongate cylindrical outer conductor and an external electrical source. The removable adapter provides a coaxial signal path having a central conductor electrically connected to the probe tip of the measurement probe and an outer conductor electrically connected to the elongate cylindrical outer conductor of the measurement probe at the notch.

In another aspect of the present invention, the removable adapter has a jack centrally disposed within and electrically insulated from the outer conductor. The outer conductor forms a sleeve having a spring biased finger formed therein for engaging the notch in the body of insulating material to make electrical contact with the elongate cylindrical outer conductor of the measurement probe. The jack makes electrical contact with the probe tip of the measurement probe and is electrically connected to a probing tip extending in a direction opposite the sleeve. The probing tip may be a current or temperature sensing device, a voltage coupling device, or the like.

The objects, advantages and novel features of the present invention are apparent from the following detailed description when read in conjunction with the appended claims and attached drawings.

BRIEF DESCRIPTION OF THE DRAWINGS

FIG. 2 is a cross-sectional view along the axis of the signal input head of the measurement probe according to the present invention.

FIG. 3 is a cross-sectional view along the axis of the signal input head of the insulating plug of the measurement probe according to the present invention.

FIG. 4 is a cross-sectional view along the axis of the removable adapter for use with the measurement probe according to the present invention.

DESCRIPTION OF THE PREFERRED EMBODIMENT

Figure 1:
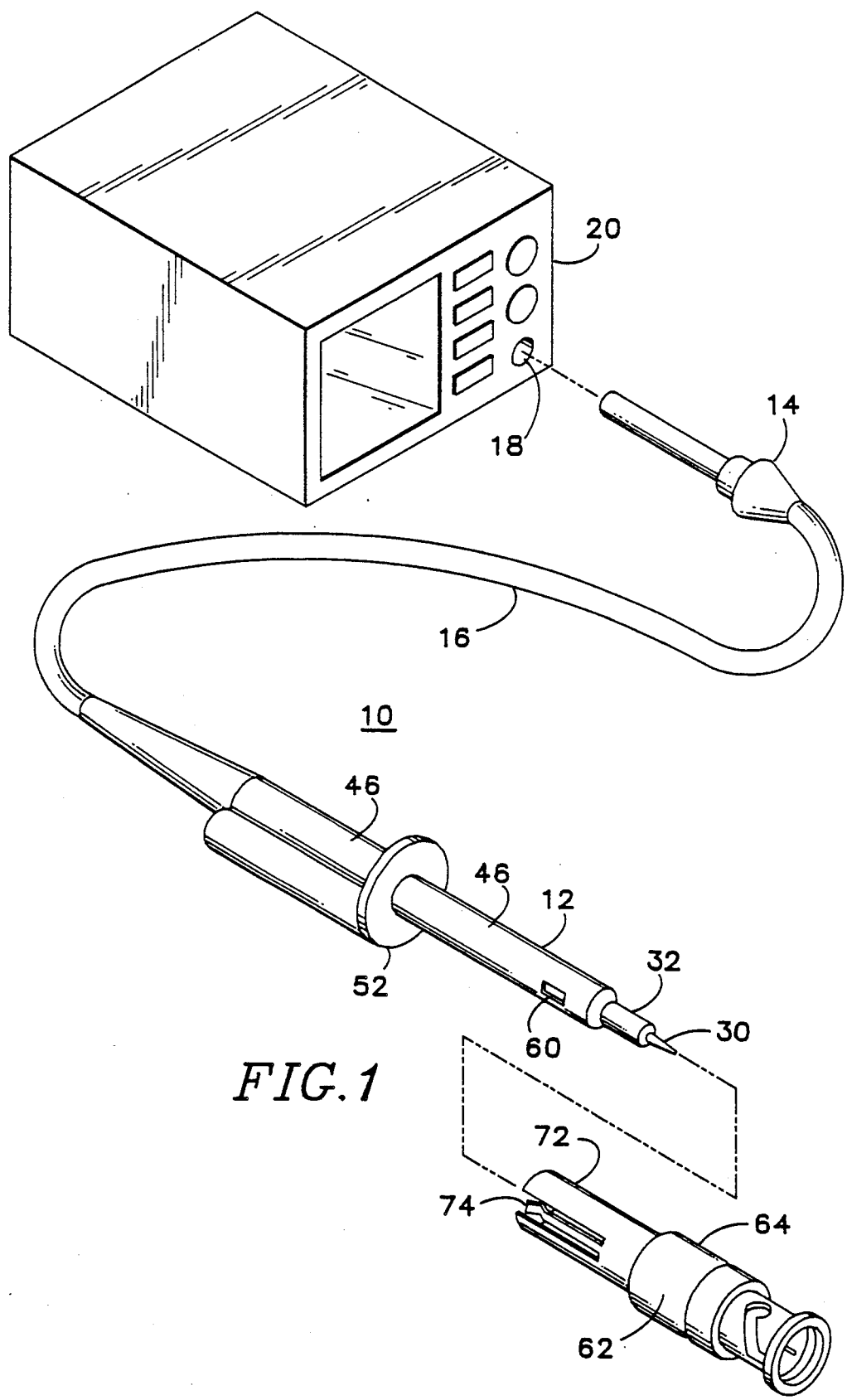
FIG. 1 is a perspective view of the measurement probe according to the present invention.
Figure 5A:
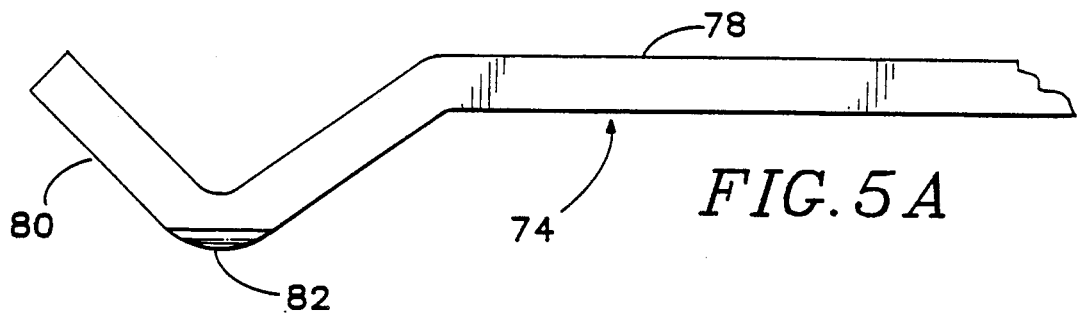
FIG. 5A is a side view of the spring biased fingers on the removable adapter according to the present invention.
Figure 5B:
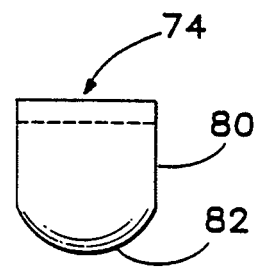
FIG. 5B is an end view of the spring biased finger on the removable adapter according to the present invention

Referring to FIGS. 1-3, there is shown a measurement probe 10 having a signal input head 12 connected to a termination output coupler 14 via a transmission line, or cable, 16. The termination output coupler 14 is connected to an input connector 18 on an oscilloscope 20 or other type of electrical test equipment. The oscilloscope 20 has the capability of performing floating measurements where the common voltage connection for the measurement probe 10 is not connected to electrical ground. In an application of this type, the termination output coupler 14 is insulated from the chassis of the instrument as well as being insulated from a user.

The probe head 12 has a probe tip 30 axially disposed within a plug of insulating material 32 with the probe tip extending beyond the ends of the insulating plug 32. One end of the probe tip 30 is used for probing a device under test while the other end is electrically connected to a substrate 34 having electrical circuitry formed thereon. The substrate 34 is disposed within an elongate electrically conductive tube 36 that forms the outer coaxial conductor of the signal input head 12 of the measurement probe 10. An insulating material 38 surrounds the substrate 34 to prevent electrical arcing between the substrate 34 and the conductive tube 36. The other end of the substrate 34 is electrically connected to an electrical jack 42 that accepts a mating electrical plug (not shown) on the end of the transmission line 16. The conductive tube 36 fits within a slot 40 formed in the insulating plug 32.

Angularly depending and electrically connected to the conductive tube 36 is an electrical conductor 44 that is used for connecting the conductive tube to an electrical source for floating measurements or electrical ground for ground referenced measurements. The signal input head 12 is covered by an insulating material 46 that provides the shape for the signal input head 12 and electrically isolates the conductive tube 36 from the user. Electrical jack 42 and electrical connector 44 are respectively exposed within apertures 48 and 50 formed in the insulating material 46 of the signal input head 12. A finger guard 52 extends radially around the signal input head 12 and is positioned away from the probe tip 30 to provide additional protection for the user. The above described measurement probe has been described with an insulating plug 32 and insulating material 46 surrounding the signal input head 12. These elements may be formed as a single element having the structure described above and here in after without departing from the scope of the invention as set forth in the appended claims.

The above described measurement probe 10 may be used for making floating measurements where the outer conductive tube 36 is connected to an electrical source, such as one of the voltage phases of a three phase electrical power source. In order to provide the necessary protection for the user and the testing equipment while making such measurements, the measurement probe 10 must meet the electrical and electronic measuring and test equipment standards (UL1244) set by Underwriters Laboratories, UL, for minimum distances between conductive elements and between conductive elements and the user for particular voltage ratings. In the preferred embodiment of the present invention, the measurement probe 10 has an AC peak voltage rating of 850 volts. To meet the UL standards for safety, there needs to be a minimum separation between conductive elements within the measurement probe 10 and between the user and any exposed conductive element in the probe 10 of 0.240 inches through air and 0.360 inches over surfaces. To meet these standards, insulating plug 32 into which the probe tip 30 is axially disposed is formed with central aperture 54 in which the probe tip 30 is exposed, as shown in FIG. 3. Surrounding the central aperture is an inner sleeve 56 which in conjunction with an outer sleeve 58 defines slot 40 into which the conductive tube 36 slidably fits. The distance between the probe tip 30 exposed within the central aperture 54 and the outer edge of the inner sleeve 58 meets the minimum over surface separation set by Underwriters Laboratories. Likewise, the over surface distance and the through air distance between the end of aperture 50 and the electrical conductor 44 are greater than the minimums set by the UL standards for a measurement probe 10 rated at 850 peak AC volts. Further, the probe 10 meets the standard for double insulated probes, which is 4 times the peak voltage rating of the probe plus 2,878 peak AC volts during 60 Hz high voltage testing. This is equal to 6,228 peak AC volts or approximately 12KV peak-to-peak. The above described probe structure also meets the Institute of Electrical and Electronic Engineers probe tip rating standards IEEE 587 for transient surges, which are equivalent to the UL double insulation standards.

While the above described probe meets the standards for a measurement probe for floating high voltage measurements, it does not provide an electrical connection for removable adapters needing a ground referenced coaxial signal path. This is because the outer conductor, in the form of the conductive tube 36, is completely insulated from the user, whereas in conventional measurement probes like the low voltage probes previously described, the outer conductor is exposed near the probe tip for accepting a removable adapter, such as the BNC adapter previously described. To provide for a ground referenced coaxial signal path, notches 60 are formed in the insulating material 46 to expose the conductive tube 36 at a safe distance from the probe tip 30. Alternatively, the notches 60 may be formed in the plug of insulating material 32. The notches 60 provide a means for electrically connecting an outer conductor 64 of a removable adapter 62 to the conductive tube 36. As is shown in FIGS. 1, 4 and 5A-B, the removable adapter 62 has a BNC type electrical connector 66 having an outer conductor 68 and a central conductor 70 at one end and a electrically conductive tubular sleeve 72 at the other. Sleeve 72 defines a bore 73 into which the measurement probe 10 is inserted. Spring biased fingers 74 are disposed within slots 76 formed in sleeve 72 for engaging the notch 60 in the insulating material 46 of the signal input head 12 of the measurement probe 10 to make electrical contact with conductive tube 36 of the probe 10. The spring biased fingers 74 have integrally formed first and second segments, respectively numbered 78 and 80, with one end of the first segment integrally formed with sleeve 72. To reduce the mechanical stresses between the spring biased fingers 74 and sleeve 72, the interconnections between segments 78 and the sleeve 72 are formed with a radius 75 that is a minimum of one forth the width of the spring biased fingers. The second segment angularly depends from the other end of the first segment into the bore 73 region and has a dome shaped apex 82 to prevent gouging of the insulating material 46 during placement of the removable adapter 62 on the measurement probe 10. In production manufacturing of the sleeve 72 with the spring biased fingers 74, a stamping process may be used to cut parallel slots in the sleeve and then deform the metal between the slots into the spring biased fingers 74.

Sleeve 72 has a flange 84 formed at one end that mates with a shoulder 86 formed in the outer conductor 68 of the BNC type connector 66. The center conductor 70 has a jack 88 at one end that is electrically insulated from the outer conductor 68 by insulating material 90. The other end of the central conductor is electrically insulated from the outer conductor 68 by insulating material 92 and forms a probing tip 94 that is coupled to a device under test for coupling voltages to the measurement probe 10.

The bore 73 of the tubular sleeve 72 allows the removable adapter 62 to slidably mate with the signal input head 12 of the measurement probe 10. The spring biased fingers 74 on the tubular sleeve 72 engage the notches 60 in the insulating material 46 to make electrical contact with the conductive tube 36. At the same time the probe tip 30 engages the jack 88 in the removable adapter 62 providing the electrical connection to the probing tip 94.

The removable adapter 62 has been described with a BNC type electrical conductor 66. Other types of electrical connectors or devices may be used with the removable adapter 62 of the present invention without departing from the scope of the invention as defined in the appended claims and equivalents thereof so long as the removable adapter 62 has spring biased fingers 74 for engaging the notch in the measurement probe 10 and a jack for electrically connecting to the probe tip of the probe 10. Other type of coaxial electrical connectors include SMA connectors, UHF, RCA and the like. Alternatively, the probing tip of the removable adapter 62 may be a current or temperature sensing device.

Figure 6A:
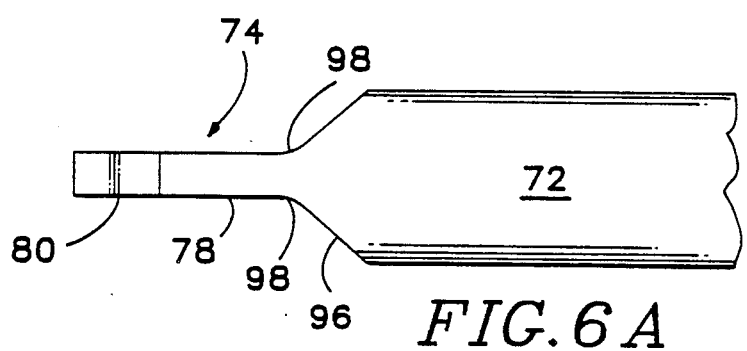
FIG. 6A is a top view of an alternative sleeve structure for the removable adapter according to the present invention.
Figure 6B:
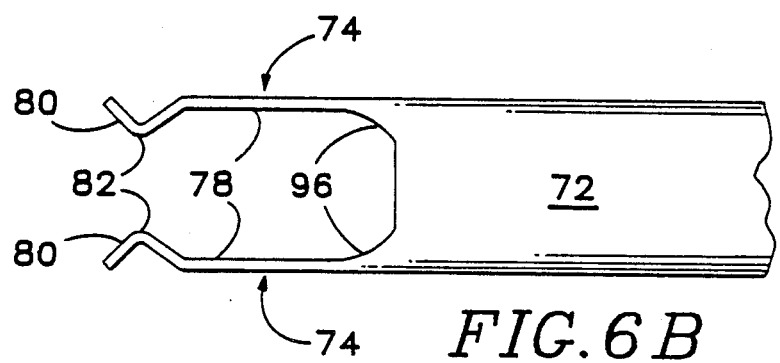
FIG. 6B is a side view of the alternative sleeve structure for the removable adapter according to the present invention.

An alternative structure for the removable adapter 62 is shown in FIGS. 6A-B. Instead of forming slots 76 within the sleeve 72 of the outer conductor 68 with the spring biased fingers 74 disposed within the slots, the sleeve is formed with approximately triangular shaped protrusions 96 extending axially from the end of the sleeve 72. Extending from the apex of the triangular shaped protrusions 96 are the spring biased fingers 74. The spring biased fingers 74 have the same structure as the fingers in the previously described embodiment. The base and the height dimensions of the triangular shaped protrusion 96 are selected as a function of the amount of force to be applied by the spring biased fingers 74 at the domed shaped apex 82 of segment 80. For example, to increase the spring force of the spring biased fingers 74, the height of the triangular shaped protrusion 96 is increased at the expense of the length of segment 78 of the spring biased fingers 74. Further, to reduce stress concentrations at the interconnection of the first segment 78 and the apex of the triangular shaped protrusion 96, a radius 98 is formed at the interconnection that is a minimum of one forth the width of the spring biased fingers 72.

A measurement probe has been described having a elongate cylindrical outer conductor with a coaxially disposed probe tip extending beyond one end of the outer conductor. A body of insulating material surrounds the outer conductor and a portion of the probe tip to provide electrical isolation between the probe tip and the outer conductor. A notch is formed in the insulating material distant from the probe tip for exposing the outer conductor to provide a means for electrically connecting an outer conductor of a removable adapter to the outer conductor of the measurement probe. The removable adapter has a tubular sleeve that slidably mates with the measurement probe and has spring biased fingers formed therein for engaging the notch in the insulating material to make electrical contact with the outer conductor of the measurement probe. A central conductor disposed within the removable adapter has a jack formed on one end thereof for making electrical contact with the probe tip of the measurement probe. The measurement probe meets all the safety standards for floating measurements while at the same time having the capability providing a ground referenced coaxial signal path for ground referenced signal measurements. These and other aspects of the present invention are set forth in the appended claims.

We claim:

1. A double insulated floating high voltage test probe comprising:
   a probe tip coaxially disposed within one end of an elongate cylindrical outer conductor having inner and outer conductive surfaces with the probe tip extending beyond the end of the outer conductor;
   a body of insulating material covering the outer conductive surface and a portion of the inner conductive surface of the elongate cylindrical outer conductor and forming an insulating plug in which a portion of the probe tip is axially disposed for providing double insulated high voltage arcing protection between the probe tip and the inner and outer conductive surfaces of the outer conductor and between a user and the outer counter, the body of insulating material having a notch formed therein that is distant from the probe tip for exposing the elongate cylindrical outer conductor to provide an electrical contact for a ground referenced coaxial signal path; and
   means for providing an electrical connection between the elongate cylindrical outer conductor and an external electrical source.

2. The high voltage test probe as recited in claim 1 wherein the electrical connection providing means comprises an electrical conductor angularly disposed and in electrical contact with the elongate cylindrical outer conductor, the angularly disposed electrical conductor being partially encapsulated by the body of insulating material, the insulating material having a central aperture axially formed with the electrical conductor to expose a portion of the electrical conductor within the aperture.

3. The high voltage test probe as recited in claim 1 further comprising a removable adapter having a jack centrally disposed within and electrically insulating from an outer conductor with the outer conductor forming a sleeve defining a bore having a spring biased finger disposed within a slot formed in the sleeve for engaging the notch in the body of insulating material to make electrical contact with the elongate cylindrical outer conductor of the high voltage test probe and the jack making electrical contact with the probe tip of the high voltage test probe, the jack being electrically connected to a probing tip extending in a direction opposite the sleeve.

4. The high voltage test probe as recited in claim 1 further comprising a removable adapter having a jack centrally disposed within and electrically insulating from an outer conductor with the outer conductor forming a sleeve defining a bore having a substantially triangular shaped portion axially extending therefrom with a spring biased finger extending from the apex of the triangular shaped portion for engaging the notch in the body of insulating material to make electrical contact with the elongate cylindrical outer conductor of the high voltage test probe and the jack making electrical contact with the probe tip of the high voltage test. probe, the jack being electrically connected to a probing tip extending in a direction opposite the sleeve.

5. The high voltage test probe as recited in claim 3 or 4 wherein the spring biased finger of the removable adapter comprises first and second integrally formed segments with one end of the first segment integrally formed with the sleeve and the second segment angularly depending into the bore from the first segment for engaging the slot in the body of insulating material, the second segment having a dome shaped apex to prevent gouging of the body of insulating material during placement of the removable adapter on the high voltage test probe.

6. The high voltage test probe as recited in claim 1 wherein the removable adapter comprises a BNC type electrical connector having a jack centrally disposed within and electrically insulating from an outer conductor with the outer conductor forming a sleeve defining a bore having a spring biased finger disposed within a slot formed in the sleeve for engaging the notch in the body of insulating material to make electrical contact with the elongate cylindrical outer conductor of the high voltage test probe and the jack making electrical contact with the probe tip of the high voltage test probe, the jack being electrically connected to a central conductor of the BNC type connector.

7. A double insulated floating high voltage test probe comprising:
   a probe tip coaxially disposed within one end of an elongate cylindrical outer conductor having inner and outer conductive surfaces with the probe tip extending beyond the end of the outer conductor;
   a body of insulating material covering the outer conductive surface and a portion of the inner conductive surface of the elongate cylindrical outer conductor and forming an insulating plug in which a portion of the probe tip is axially disposed for providing double insulating high voltage arcing protection between the probe tip and the inner and outer conductive surfaces of the outer conductor and between a user and the outer conductor, the body of insulating material having a notch formed therein that is distant from the probe tip for exposing the elongate cylindrical outer conductor;
   an electrical conductor angularly disposed and in electrical contact with the elongate cylindrical outer conductor for providing an electrical connection with an external electrical source, the angularly disposed electrical conductor being partially encapsulated by the body of insulting material, the insulating material having a central aperture axially formed with the electrical conductor to expose a portion of the electrical conductor within the aperture; and
   removable adapter providing a ground referenced coaxial signal path having a central conductor electrically connected to the probe tip and an outer conductor electrically connected to the elongate cylindrical outer conductor at the notch.

8. The high voltage test probe as recited in claim 7 wherein the removable adapter comprises a jack centrally disposed within and electrically insulating from the outer conductor with the outer conductor forming a sleeve defining a bore having a spring biased finger disposed within a slot formed in the sleeve for engaging the notch in the body of insulating material to make electrical contact with the elongate cylindrical outer conductor of the high voltage test probe, the jack being part of the central conductor and making electrical contact with the probe tip of the high voltage test probe and being electrically connected to a probing tip extending in a direction opposite the sleeve.

9. The high voltage test probe as recited in claim 7 wherein the removable adapter comprises a jack centrally disposed within and electrically insulated from the outer conductor with the outer conductor forming a sleeve defining a bore having a substantially triangular shaped portion axially extending therefrom with a spring biased finger extending from the apex of the triangular shaped portion for engaging the notch in the body of insulating material to make electrical contact with the elongate cylindrical outer conductor of the high voltage test probe, the jack being part of the central conductor and making electrical contact with the probe tip of the high voltage test probe and being electrically connected to a probing tip extending in a direction opposite the sleeve.

10. The high voltage test probe as recited in claims 8 or 9 wherein the spring biased finger of the removable adapter comprises first and second integrally formed segments with one end of the first segment integrally formed with the sleeve and the second segment angularly depending into the bore from the first segment for engaging the slot in the body of insulating material, the second segment having a dome shaped apex to prevent gouging of the body of insulating material during placement of the removable adapter on the high voltage test probe.

11. The high voltage test probe as recited in claim 7 wherein the adapter comprises a BNC type electrical connector having a jack centrally disposed within and electrically insulated from the outer conductor with the outer conductor forming a sleeve defining a bore having a spring biased finger diposed within a slot formed in the sleeve for engaging the notch in the body of insulating material to make electrical contact with the elongate cylindrical outer conductor of the high voltage test probe and the jack being electrically connected to the central conductor and making electrical contact with the probe tip of the high voltage test probe.

12. A removable adapter for use with a double insulated floating high voltage test probe having a probe tip coaxially disposed within one end of an elongate cylindrical outer conductor having inner and outer conductive surfaces with the probe tip extending beyond the outer conductor and axially disposed within an insulating plug formed in a body of insulating material covering the outer conductive surface and a portion of the inner conductive surface of the outer conductor for providing double insulating high voltage arcing protection between the probe tip and the inner and outer conductive surfaces of the outer conductor and between a user and the outer conductor, the body of insulating material having a notch formed therein that is distant from the probe tip for exposing the elongate cylindrical outer conductor, the removable adapter comprising a center conductor electrically connected to the probe tip of the high voltage test probe and an outer conductor having a spring biased finger formed therein for electrically connecting the outer conductor to the elongate cylindrical outer conductor of the high voltage test probe at the notch.

13. The removable adapter for use with a high voltage test probe as recited in claim 12 further comprising a jack centrally disposed within and electrically insulated from a sleeve formed by the outer conductor with the sleeve defining a bore having the spring biased finger disposed within a slot formed in the sleeve for making electrical contact with the elongate cylindrical outer conductor of the high voltage test probe and the jack making electrical contact with the probe tip of the high voltage test probe, the jack being electrically connected to a probing tip extending in a direction opposite the sleeve.

14. The removable adapter for use with a high voltage test probe as recited in claim 12 further comprising a jack centrally disposed within and electrically insulated from a sleeve formed by the outer conductor with the sleeve defining a bore having a substantially triangular shaped portion axially extending from the sleeve with a spring biased finger extending from the apex of the triangular shaped portion for engaging the notch in the body of insulating material to make electrical contact with the elongate cylindrical outer conductor of the high voltage test probe and the jack making electrical contact with the probe tip of the high voltage test probe, the jack being electrically connected to a probing tip extending in a direction opposite the sleeve.

15. The removable adapter as recited in claims 13 or 14 wherein the spring biased finger comprises first and second integrally formed segments with one end of the first segment integrally fromed with the sleeve and the second segment angularly depending into the bore from the first segment for engaging the slot in the body of insulating material, the second segment having a dome shaped apex to prevent gouging of the body of insulating material during placement of the removable adapter on the high voltage test probe.

16. The removable adapter for use with a high voltage test probe as recited in claim 13 or 14 wherein the probing tip comprises a current sensing device.

17. The removable adapter for use with a high voltage test probe as recited in claim 13 or 14 wherein the probing tip comprises a temperature sensing device.

18. The removable adapter for use with a high voltage test probe as recited in claim 13 or 14 wherein the probing tip comprises a voltage coupling device.

19. The removable adapter for use with a high voltage test probe as recited in claim 12 further comprising a BNC type electrical connector having a jack centrally disposed within and electrically insulated from a sleeve formed by the outer conductor with the sleeve having the spring biased fingers formed therein, the jack being electrically connected to the central conductor and making electrical contact with the probe tip of the high voltage test probe.

20. The high voltage test probe as recited in claim 1 wherein the insulating plug comprises inner and outer sleeves defining a slot into which the elongate cylindrical outer conductor slidably fits with the inner sleeve defining an aperture into which the probe tip extends.

21. The high voltage test probe as recited in claim 7 wherein the insulating plug comprises inner and outer sleeves defining a slot into which the elongate cylindrical outer conductor slidably fits with the inner sleeve defining an aperture into which the probe tip extends.

* * * * *